(12) United States Patent
Chu et al.

(10) Patent No.: US 11,837,598 B2
(45) Date of Patent: Dec. 5, 2023

(54) SEMICONDUCTOR DEVICE ELECTROSTATIC DISCHARGE DIODE

(71) Applicant: TAIWAN SEMICONDUCTOR MANUFACTURING COMPANY, LTD., Hsinchu (TW)

(72) Inventors: Li-Wei Chu, Hsinchu (TW); Wun-Jie Lin, Hsinchu (TW); Yu-Ti Su, Hsinchu (TW); Ming-Fu Tsai, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 200 days.

(21) Appl. No.: 17/459,878

(22) Filed: Aug. 27, 2021

(65) Prior Publication Data

US 2023/0068649 A1 Mar. 2, 2023

(51) Int. Cl.
*H01L 27/02* (2006.01)
*H01L 29/06* (2006.01)

(52) U.S. Cl.
CPC ...... *H01L 27/0248* (2013.01); *H01L 29/0649* (2013.01)

(58) Field of Classification Search
CPC ............ H01L 27/0288; H01L 29/0649; H01L 27/0248; H01L 28/20; H01L 29/42324; H01L 29/788; H01L 21/761; H01L 29/0634; H01L 29/7835; H01L 29/1095; H01L 21/26513; H01L 29/66681; H01L 29/47; H01L 29/402; H01L 29/0623; H01L 29/66659; H01L 29/7816; H01L 29/1083; H01L 21/76224; H01L 29/0653; H01L 29/1045; H01L 29/0847; H01L 29/0878; H01L 21/76283; H01L 29/7823; H01L 29/0696; H10B 41/30
USPC ....... 257/133, 170, 164, 173, 566, 339, 343, 257/657, 517, 355, 356, E29.256, 257/E21.427, E29.327, E29.174; 438/140, 135, 286
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2010/0314712 A1* | 12/2010 | Arai | ............... H01L 27/1203 257/E29.174 |
| 2014/0040838 A1 | 2/2014 | Liu et al. | |
| 2015/0278429 A1 | 10/2015 | Chang | |
| 2017/0194477 A1* | 7/2017 | Lin | ...................... H01L 29/402 |

* cited by examiner

*Primary Examiner* — Mouloucoulaye Inoussa
(74) *Attorney, Agent, or Firm* — Hauptman Ham, LLP

(57) ABSTRACT

A semiconductor device includes a first doped zone and a second doped zone in a first semiconductor material, the first doped zone being separated from the second doped zone; an isolation structure between the first doped zone and the second doped zone; and a first line segment over a top surface of the first doped zone, where the ends of the first line segment and the ends of the second line are over the isolation structure. The first line segment and the second line segment have a first width; and a dielectric material is between the first line segment and the second line segment and over the isolation structure. The first width is substantially similar to a width of a gate electrode in the semiconductor device.

20 Claims, 11 Drawing Sheets

SEMICONDUCTOR DEVICE ELECTROSTATIC DISCHARGE DIODE

BACKGROUND

Electrostatic discharge (ESD) protection of a semiconductor device is implemented using ESD protection devices which route large electrical currents around portions of a semiconductor device or integrated circuit to prevent circuit breakdown upon exposure to transient high voltages or large currents. ESD protection devices (ESD devices) have junction voltages which help to prevent current flow during normal operation conditions, and which allow current flow during transient high voltage/large current situations. ESD devices provide a more robust semiconductor device with increased lifetime as compared to semiconductor devices without ESD protection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
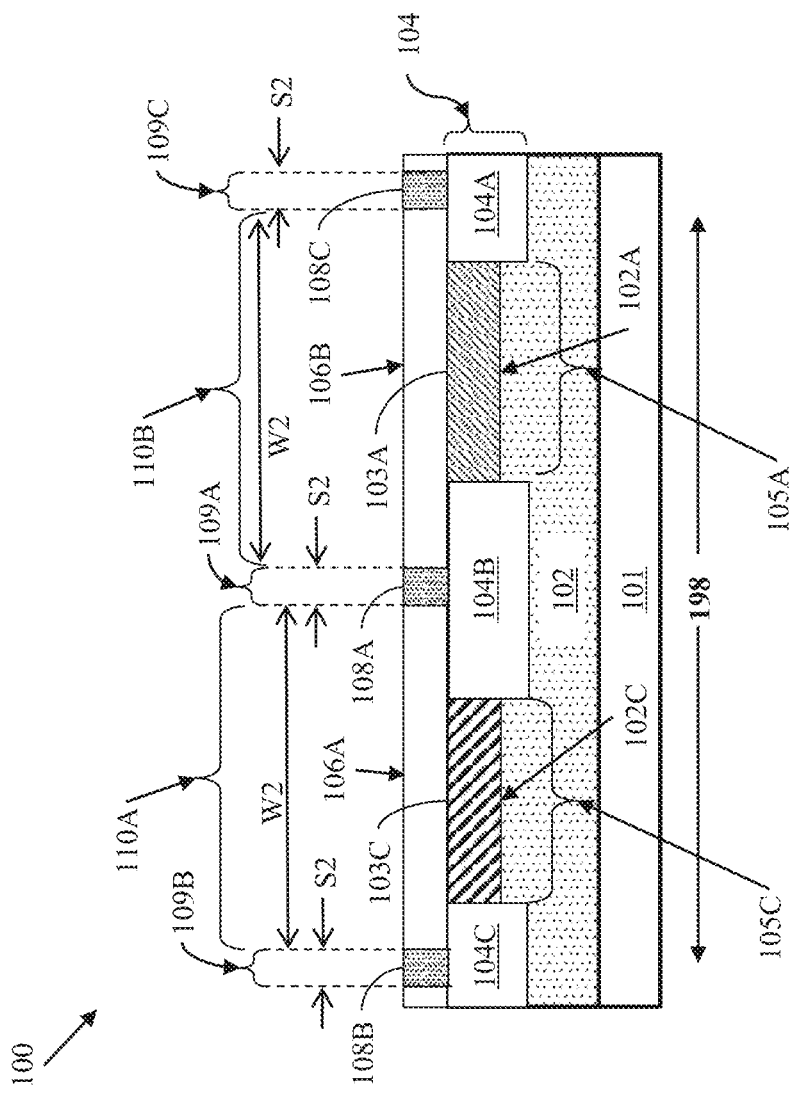
FIG. 1 is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed toward a semiconductor device which includes an ESD device to protect the semiconductor device from high current or high voltage conditions. In some embodiments, the ESD device described herein is smaller than other ESD devices at least because the ESD devices described herein is able to operate without an exclusion zone separating the ESD devices from other portions of the semiconductor device. By reducing the area for an ESD device (e.g., by eliminating the exclusion zone around the ESD device), the die area of a semiconductor device is also reduced. In some embodiments, the present disclosure also describes an ESD device which is manufactured using the same patterning masks as other elements of the semiconductor device, reducing manufacturing cost. In some embodiments, the ESD devices described herein are associated with a lower value of $R_{ON}$, providing a faster response to high voltage and high current conditions than ESD devices without the features described herein.

FIG. 1 is a cross-sectional view of a semiconductor device 100 in accordance with some embodiments. Semiconductor device 100 includes two electrostatic discharge (ESD) devices comprising a dopant zone in an ESD device region, and a conductive line over the dopant zone, for handling transient voltage spikes applied to semiconductor device 100.

In FIG. 1, a first semiconductor material 102 is deposited over a substrate 101. In some embodiments, the substrate is a semiconductor material which is connected to a ground or to a voltage source. In some embodiments, the substrate is a dielectric material which electrically isolates the first semiconductor material from the bottom (e.g., the side of the substrate opposite from the first semiconductor material) of the semiconductor device, and electrostatic discharge (ESD) devices in the semiconductor device are discharged laterally through the first semiconductor material. In some embodiments, the first semiconductor material 102 comprises silicon, silicon germanium, gallium arsenide, or some other semiconductor material. ESD device regions 102A and 102C are regions of the first semiconductor material 102 which have been doped by adding dopant atoms to form doped zones 103A and 103C in the first semiconductor material 102.

Semiconductor device 100 includes doped zones 103A and 103C, where dopant atoms (dopant atom material) has been added to the first semiconductor material 102 by, e.g., an implant process. Dopant atoms are added in the doped zones 103A and 103C in order to form junctions in portions of the first semiconductor material. A junction in the first semiconductor material resists current flow until a threshold voltage is achieved. The degree of doping in the first semiconductor material relates to the magnitude of the threshold voltage which resists current flow through the ESD device. The resistance of the ESD device (or, the resistance of the semiconductor device to current flow through the ESD device) is $R_{ON}$. Once the threshold voltage is achieved, a smaller Rory value is associated with a faster response by the ESD device to a high voltage or a high current condition in the semiconductor device, and is associated with reduced likelihood of damage of the semiconductor device by the electrostatic discharge.

In some embodiments, an ESD device includes line segments and vias or contacts electrically connected to the top surface of the doped zones of the first semiconductor material (e.g., an interconnect structure against the top surface of the doped zones of the first semiconductor material). In some embodiments, the line segments are positioned directly against the top surface of the doped zones of the first semiconductor material, and a contact or via electrically connects to the top surface of the line segment. Line segments are linear portions of a current-carrying material which form an electrical path for current to flow through the ESD device. In some embodiments, the line segments comprise a metal. In some embodiments, the line segments comprise a semiconductor material. In some embodiments, the line segments include a second semiconductor material different from the first semiconductor material. In some embodiments, the line segments are a second semiconductor material the same as the first semiconductor material. In some embodiments, the line segments are poly lines having a same dimension in the second direction as gate electrodes of transistors in the semiconductor device (See semiconductor device 200).

$R_{ON}$ values are associated with the dimensions (see, e.g., second direction 299 of semiconductor device 200) of line segments against the top surface of the doped zones. When line dimensions are uneven, the value of $R_{ON}$ changes unpredictably. By making the line dimensions more uniform, the value of $R_{ON}$ becomes more reproducible for the ESD devices in a single semiconductor device, and for a manufacturing process which produces ESD devices in different semiconductor devices on different wafers or substrates. Gate electrode length is a well-characterized and well-controlled dimension in semiconductor devices. Thus, by manufacturing the line segments of an ESD device in a semiconductor device using the same processing steps as are used to manufacture gate electrodes for transistors of the semiconductor device, the line segment dimensions are manufactured with a well-characterized process having good dimensional control.

In semiconductor device 100, doped zones 103A is in a pillar 105A of first semiconductor material 102, and doped zone 103C is in a pillar 105C of semiconductor material 102. In some embodiments, isolation structure 104 is formed by [1] etching the first semiconductor material 102 and filling the etched opening with a dielectric material, or [2] oxidizing (by, e.g., steam oxidation) the first semiconductor material 102 to form the isolation structure dielectric material, although other processes of forming an isolation structure at a surface of the first semiconductor material 102 are also within the scope of the present disclosure. Sidewalls of the pillars of the first semiconductor material 102 (e.g., the sides of the doped zones 103A and 103C) are against the isolation structure 104. In some embodiments, the sides of the doped zones are also against the trench isolation structures (see trench isolation structures 719A-719C, in semiconductor device 700, below). Doped zones 103A and 103C are in upper regions of the pillars of the first semiconductor material 102. In some embodiments, the doped zones such as doped zones 103A and 103C do not extend to the bottom of the pillars of first semiconductor material to increase the electrical isolation of the doped zones from each other.

In FIG. 1, line segment 106A is electrically connected to the top surface of doped zone 103C in ESD device region 102C. Line segment 106A extends from above isolation structure 104 at a first side of doped zone 103C, over the top surface of doped zone 103C, to the top surface of isolation structure 104 at a second side of doped zone 103C, the second side being opposite the first side of doped zone 103C. Line segment 106B is electrically connected to the top surface of doped zone 103A in ESD device region 102A. Line segment 106B extends from above isolation structure 104 at a first side of doped zone 103A, over the top surface of doped zone 103A, to the top surface of isolation structure 104 at the second side of doped zone 103A, the second side of doped zone 103A being opposite from the first side of doped zone 103A. Isolation structure 104 is at an upper side of the first semiconductor material 102, and laterally surrounds (see doped zone 204 in FIG. 2, below) the doped zones 103A and 103C. Isolation structure 104 is divided into isolation structure portions 104A, 104B, and 104C, according to the position of the isolation structure portion with regard to a doped zone. Thus, isolation structure portion 104A and isolation structure portion 104B are against the sides of doped zone 103A and ESD device 102A, and isolation structure portion 104B and isolation structure portion 104C are against the sides of doped zone 103C and ESD device 102C. Isolation structure portion 104B is between the first side of doped zone 103A and the second side of doped zone 103C.

Line segment 106A and line segment 106B include a second semiconductor material. Line segment 106A is in line segment zone 110A, and line segment 106B is in line segment zone 110B. In some embodiments, the line segment zones have different line segment widths. In some embodiments, the second semiconductor material comprises silicon, silicon germanium, gallium arsenide, or some other semiconductor material compatible with a gate electrode structure in a semiconductor device integration scheme. Line segment 106A and line segment 106B are separated from each other by a dielectric material portion 108A in a trim region 109A. Line segments 106A and 106B extend along a first direction 198 of the semiconductor device 100. Line segments 106A and 106B have a line segment width (W2) along the first direction 198. Line segments 106A and 106B have a line segment width (not shown) in a second direction (not shown) perpendicular to the first direction 198, where the line segment width corresponds to a gate electrode dimension over a channel of a transistor in the semiconductor device. In some embodiments, line segment width W2 ranges from 0.01 μm to about 1 μm. Line segment widths smaller than 0.01 μm result in poor conductivity and increased values of $R_{ON}$ (ESD device threshold resistance), in some instances. Line segment widths greater than about 1 μm do not demonstrate increased current carrying capacity, and space in the semiconductor device layout is wasted with no reduction of $R_{ON}$ or increase in current carrying capacity, in some instances.

Trim regions 109A-109C are portions of semiconductor device 100 where the second semiconductor material has been trimmed away to define line segments 106A and 106B. Trim region 109A is the trim region over isolation structure 104 where dielectric material portion 108A has been deposited, between line segment 106A and line segment 106B. Trim region 109B is the trim region over isolation structure 104 at an end of line segment 106A distal from trim region 109A. Trim region 109C is the trim region over isolation structure 104 over the end of line segment 106B distal from trim region 109A. Trim regions 109A, 109B, and 109C have a trim region width S2. In some embodiments, the trim regions on either side of a line segment have different trim region widths. In some embodiments, trim region widths range from about 0.01 μm to about 0.1 μm. Trim region widths smaller than about 0.01 μm result in lower reliability of the semiconductor device/ESD device because of breakdown of the dielectric in the trim region between line segments of the ESD device, in some instances. Trim region widths larger than about 0.1 μm are associated with uneven etch profiles of the line segments in an ESD device (e.g., over the ESD device area), and dummy line segments over isolation structures (see, e.g., dummy line segment 206B of semiconductor device 200, described below), in some instances.

Dielectric material portions 108A, 108B, and 108C are situated at the ends of line segments 106A and 106B. Dielectric material portions 108A, 108B, and 108C are over isolation structure 104, and at least a portion of each end of the line segments 106A and 106B is over the isolation structure 104. The dielectric material of dielectric material portions 108A-108C is also along the longer sides of line segments 106A and 106B over isolation structure 104 and the ESD device regions 102A and 102C. In some embodiments, the dielectric material is silicon dioxide. In some embodiments, the dielectric material comprises multiple layers of dielectric material, including silicon dioxide (k=3.9), a high-k dielectric material (e.g., k 3.9), or some other dielectric material compatible with deposition at a FEOL (front end of line) location in a semiconductor device integration scheme. In some embodiments, the dielectric material also extends over a top side of the line segments and electrical connections (contacts, or vias) to the line segments extend through the dielectric material.

Figure 2:
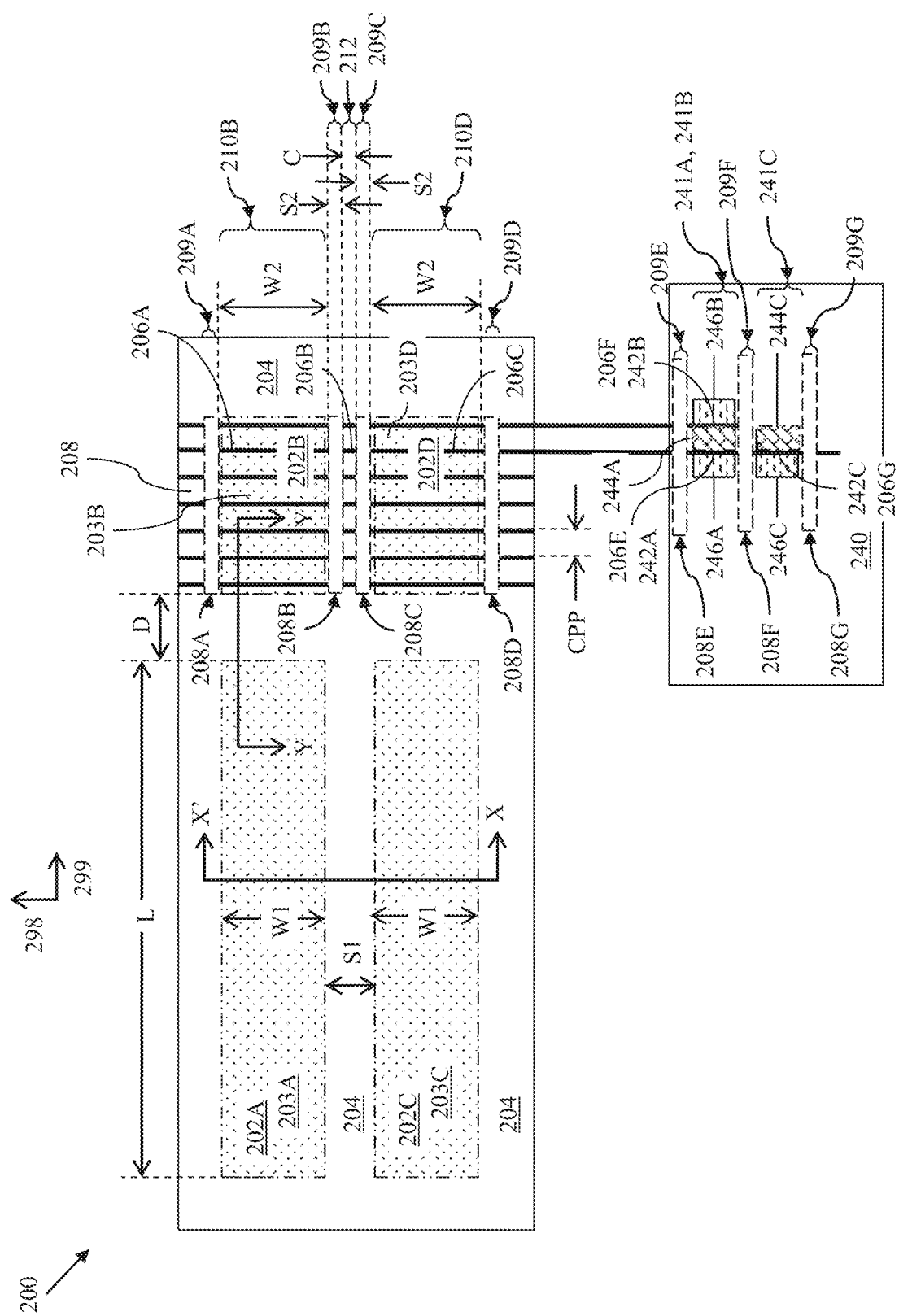
FIG. 2 is a top view of a semiconductor device, in accordance with some embodiments.

FIG. 2 is a top view of a semiconductor device 200, in accordance with some embodiments. Elements of semiconductor device 200 which have a similar structure or function as an element of semiconductor device 100 have a same identifying numeral, incremented by 100.

In FIG. 2, elements of semiconductor device 200 are described with respect to a first direction 298 and a second direction 299 parallel to a top surface of a substrate of the semiconductor device 200, where the second direction 299 is perpendicular to the first direction 298.

Semiconductor device 200 includes four ESD device areas: ESD device area 202A, ESD device area 202B, ESD device area 202C, and ESD device area 202D. ESD device areas 202A-202D are laterally surrounded in the top view by an isolation structure 204. ESD device areas 202A-202D in semiconductor device 200 include doped zones 203A-203D in a first semiconductor material. In some embodiments, the semiconductor material is intrinsic silicon. In some embodiments, the semiconductor material is a doped silicon material. In some embodiments, the semiconductor material is a type III-V semiconductor material. In some embodiments, the semiconductor material is silicon germanium (SiGe). In some embodiments, the semiconductor material is gallium arsenide (GaAs), or some other semiconductor material suitable for a front-end of line (FEOL) integration scheme. In some embodiments, the semiconductor material is deposited over a substrate (e.g., part of a silicon-on-insulator, SOI substrate). In some embodiments, the semiconductor material is the bulk material of a wafer or substrate for semiconductor device manufacturing. In some embodiments, the doped zones in the first semiconductor material include a net quantity of N-type dopant. In some embodiments, the doped zones in the first semiconductor material include a net quantity of P-type dopant. In some embodiments, some of the doped zones include a net quantity of N-type dopant and a net quantity of P-type dopant.

Doped zones 203A-203D have an ESD device area width (W1) extending in the first direction 298. In some embodiments, W1 approximately the same as the dimension of a semiconductor device active area along the first direction 298. In some embodiments, the ESD device area width W1 is less than W2. Thus, in some embodiments, 0.01 μm<W1<1.0 μm. W1 is smaller than W2 in order for the ends of line segments over the ESD device areas in a semiconductor device to end over the isolation structure around the ESD device area, and not end over the ESD device area. By positioning the ends of line segments over the isolation structure, the likelihood of the doped zone material breaking down during an ESD discharge is reduced.

CPP (cut poly line pitch) is a dimension between the line segments over an ESD device. In some embodiments, CPP is the same as the smallest pitch between transistor gate electrodes in a semiconductor device. In semiconductor device 200, CPP is measured along the second direction 299. In some embodiments, CPP ranges from about 1 nm to about 5 nm, although other values of CPP are also envisioned within the scope of the present disclosure. Line segments manufactured for CPP smaller than about 5 nm are difficult to manufacture with uniform line width, in some instances. Line segments manufactured for CPP larger than about 25 nm do not demonstrate improvements in line uniformity, lower $R_{ON}$, or current-carrying capacity of the ESD device, in some instances.

Doped zones 203A and 203C have an ESD device area length (L) extending in the second direction 299. In some embodiments, ESD device area length (L) ranges from 1 CPP to 2000 CPP. Thus, ESD device area length L includes a minimum of one line segment (see line segment 206A over ESD device area 202B), but not more than 2000 line segments. In semiconductor devices with more than 2000 line segments (e.g., with L>2000 CPP) there is minimal improvement in semiconductor device protection or current carrying capacity of the ESD devices, in some instances.

A first separation distance (D) separates ESD device area 202A from ESD device area 202B, and separates ESD device area 202C from ESD device area 202D. In some embodiments, the first separation distance (D) ranges from 1 CPP to 100 CPP. The first separation distance D is at least one CPP (e.g., at least one inactive line segment is over the isolation structure between two ESD device areas), and not more than 100 CPP (not more than 100 inactive line segments). In semiconductor devices with more than a 100 CPP distance between ESD devices, there is considerable increase in the space designated for the ESD devices (e.g., a de facto exclusion zone around the ESD devices) little or no improvement in ESD device or semiconductor device performance, in some instances.

Trim region 209A corresponds to the location of dielectric material portion 208A. Trim region 209B corresponds to the location of dielectric material portion 208B. Trim region 209C corresponds to the location of dielectric material portion 208C. Trim region 209D corresponds to the location of dielectric material portion 208D.

Dielectric material portions 208A and 208B are between line segments extending in the first direction 298. Dielectric material portions 208A and 208B are at the ends of line segments 206A over ESD device area 202B. Dielectric material portions 208C and 208D are at the ends of line segments 206C over ESD device area 202D. Dielectric material portions 208B and 208C are at the ends of dummy line segments 206B over isolation structure 204 between ESD device area 202B and ESD device area 202D. Dummy line region 212 is entirely over isolation structure 204 between ESD device area 202B and ESD device area 202D. Line segment zone 210B includes line segments 206B over ESD device area 202B. Line segment zone 210D includes line segments 206C over ESD device area 202D.

Figure 5:
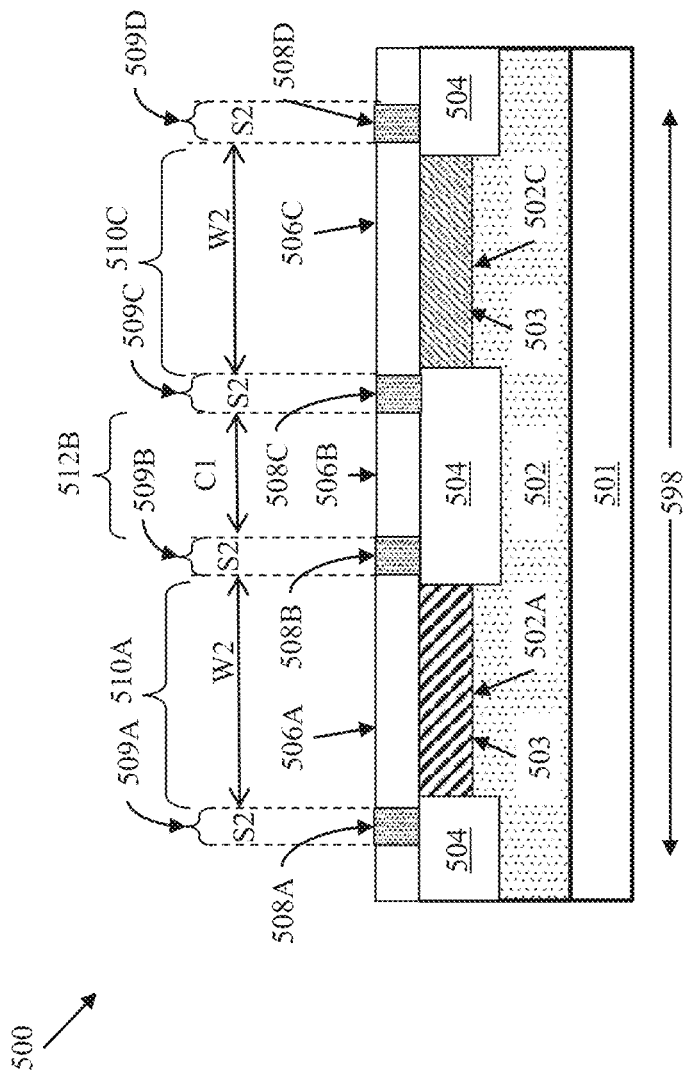
FIG. 5 is a cross-sectional view of a semiconductor device, in accordance with some embodiments.
Figure 6:
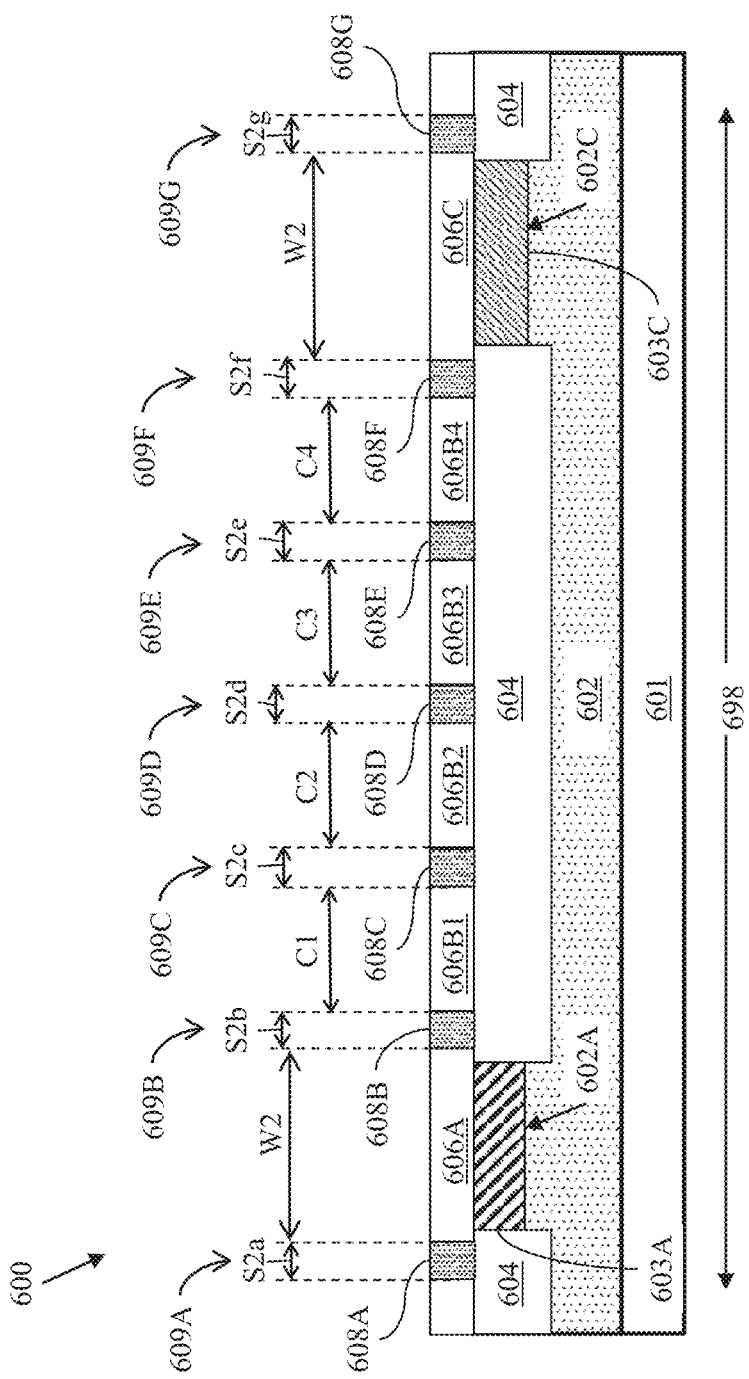
FIG. 6 is a cross-sectional view of a semiconductor device, in accordance with some embodiments.

Cross-sectional line X-X' extends along the first direction 298 and is aligned with (e.g., intersects) line segments of semiconductor device 200 in ESD device areas 202B and 202D. FIG. 5, described below, is a cross sectional view along a first direction 598 similar to the cross-sectional view X-X' along the first direction 298. In FIG. 5, a single dummy line segment 506B is over isolation structure 504 between ESD device areas 502A and 502C of semiconductor device 500. FIG. 6, described below, is a cross-sectional view along a first direction 698 similar to the cross-sectional view X-X' along the first direction 298. In FIG. 6, dummy line segments 606B1, 606B2, 606B3, and 606B4, are over isolation structure 604 between doped zone 603A and doped zone 603C of semiconductor device 600.

Figure 7:
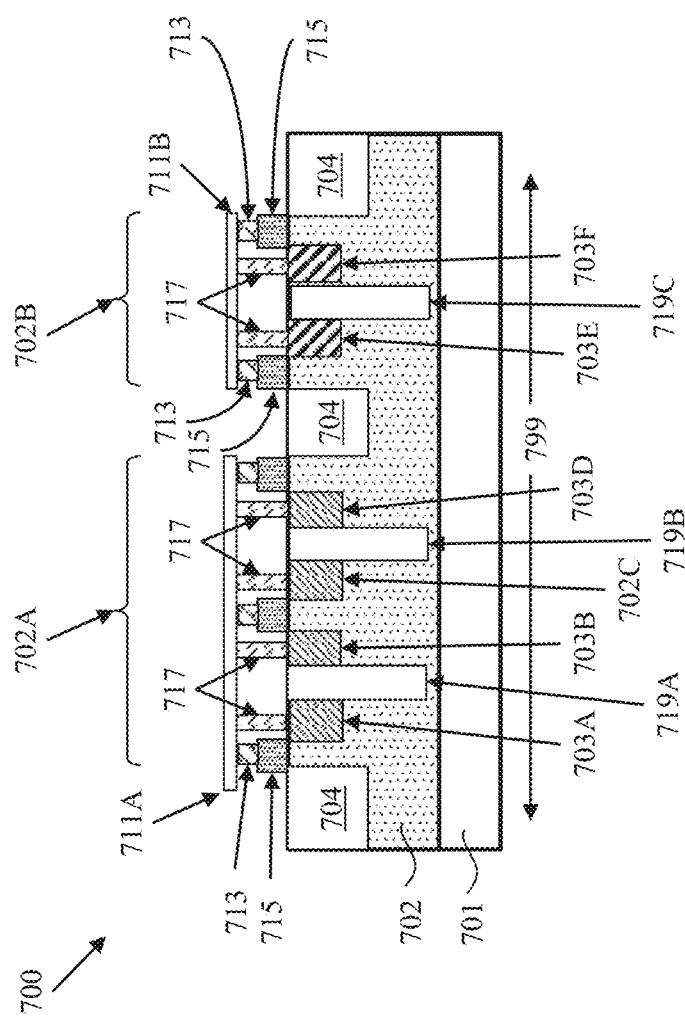
FIG. 7 is a cross-sectional view of a semiconductor device, in accordance with some embodiments.

Cross sectional line Y-Y' extends along the second direction 299 and extends across several line segments of semiconductor device 200 in ESD device areas 202A and 202B. FIG. 7, described below, is a cross sectional view along a second direction 799 similar to the cross sectional view Y-Y' along the second direction 299. In FIG. 7, several trench isolation structures 719A, 719B, and 719C extend through first semiconductor material 702 between ESD device areas in the first semiconductor material 702, extending along the sides of the ESD device areas in the first direction 798.

ESD device areas 202A-202D are doped zones of a semiconductor material (not shown, but below both the ESD device areas 202A-202D the isolation structure 204).

In FIG. 2, semiconductor device 200 includes a transistor region 240. In transistor region 240, transistors 241A, 241B, and 241C are aligned with ESD devices 202B and 202D. Transistor 241A includes a gate electrode 242A over a first channel (not shown) located between source 244A and drain 246A. Transistor 241B includes a gate electrode 242B over a second channel (not shown) located between source 244A and drain 246B. Source 244A is a shared source for transistor 241A and transistor 241B. In semiconductor device 200, transistor 241C includes a gate electrode 242C over a third channel (not shown) between source 244B and drain 246C.

Gate electrode 242A is aligned with the line segment 206A along the first direction 298. Gate electrode 242A (or, line segment 206E) include a same material as line segment 206A and has a same line length along the second direction as line segment 206A. Gate electrode 242C (or, line segment 206G) includes a same semiconductor material as line segment 206A and has a same line length along the second direction as gate electrode 242A and line segment 206A. Gate electrode 242B includes a same semiconductor material as line segment 206A and has a same line length along the second direction as line segment 206A, and is shifted by one separation distance CPP along the second direction 299 from gate electrode 242A. In some embodiments, the transistor gate electrodes are arranged perpendicular to the orientation of the line segments over ESD device areas (e.g., the line segments align along a first direction, and the transistor gate electrodes align along the second direction perpendicular to the first direction).

Gate electrode 242A and gate electrode 242B contact a first end (e.g., closer to ESD device area 202D) along the first direction by dielectric material portion 208E in trim zone 209E, and at a second end (e.g., farther from ESD device area 202D) along the first direction by dielectric material portion 208F in trim zone 209F. Gate electrode 242C contact a first end (e.g., closer to ESD device area 202D) along the first direction by dielectric material portion 208F in trim zone 209F, and at a second end (e.g., farther from ESD device area 202D) along the first direction by dielectric material portion 208G in trim zone 209G.

Figure 3:
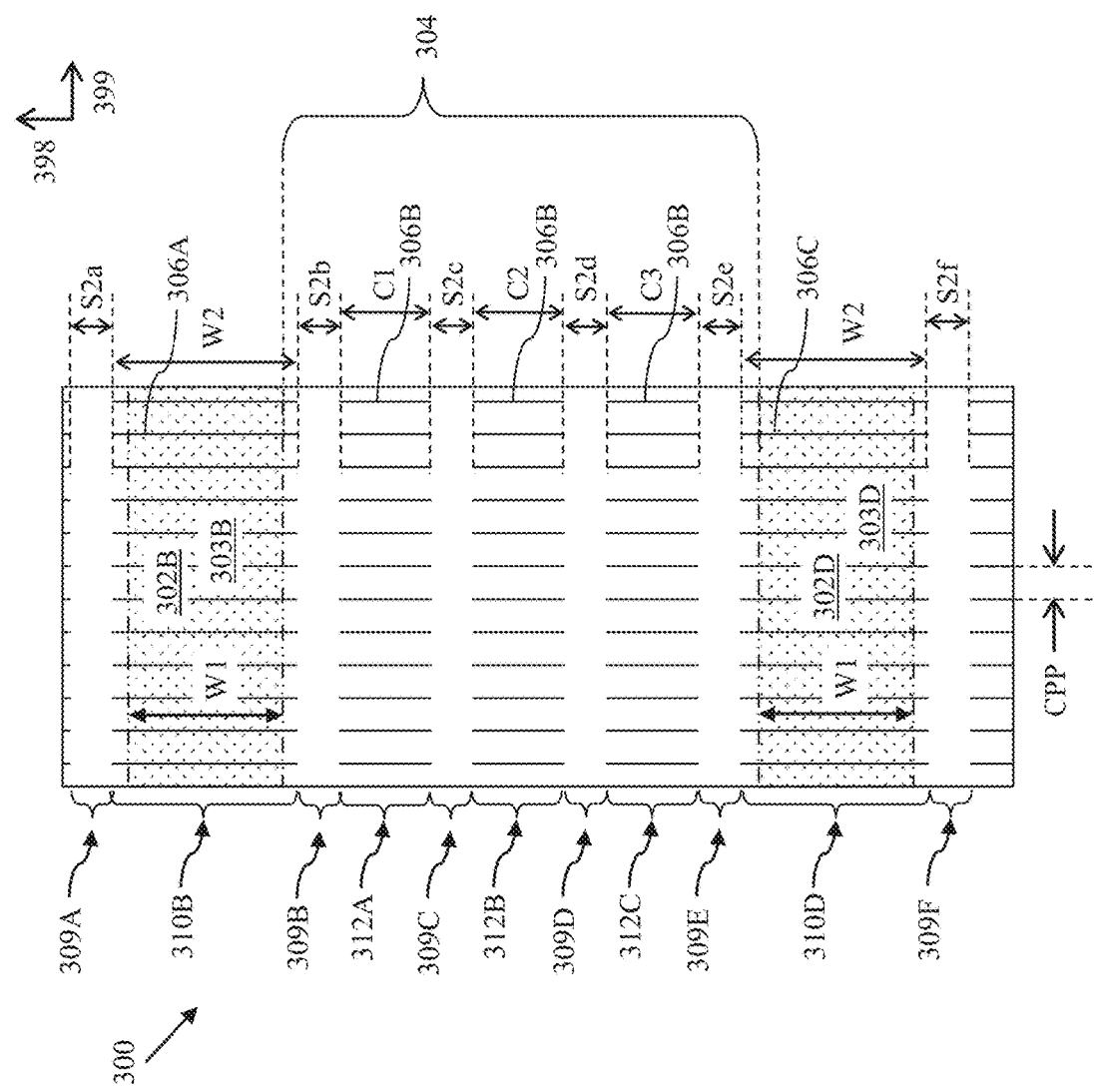
FIG. 3 is a top view of a semiconductor device, in accordance with some embodiments.

FIG. 3 is a top view of a semiconductor device 300, in accordance with some embodiments. Elements of semiconductor device 300 which have a same function or structure as elements of semiconductor device 200 have a same identifying numeral, incremented by 100. Terminal letters in the identifiers of elements of semiconductor device 300 indicate separate instances of the element referenced by the identifying numeral.

In FIG. 3, semiconductor device 300 includes two ESD device areas: ESD device area 302B and ESD device area 302D. In the top view of FIG. 3, ESD device area 302B is separated from ESD device area 302D by an isolation structure 304. Isolation structure 304 is directly over a top surface of a first semiconductor material (not shown) between ESD device area 302B and ESD device area 302D. ESD device area 302B and ESD device area 302D are doped zones 303B, 303D of first semiconductor material which extend up along the sides of the isolation structure 304. Doped zones 303B and 303D form junctions with undoped first semiconductor material below the doped zones 303B, 303D. The junctions thus formed serve as a resistor which helps to prevent current from flowing through the ESD devices of semiconductor device 300 until a threshold voltage or a threshold current are exceed during operation of the semiconductor device 300.

Line segments 306A are located in a line segment zone 310B over ESD device area 302B of semiconductor device 300. Line segments 306C are located in a line segment zone 310D over ESD device area 302D of semiconductor device 300. Dummy line segments 306B are over isolation structure 304 between doped zone 303B and doped zone 303D. Dummy line segments 306B are located in dummy line zones 312A, 312B, 312C of semiconductor device 300. Dummy line segments 306B in dummy line zone 312A have a first dummy line width C1. Dummy line segments 306B in dummy line zone 312B have a first dummy line width C2. Dummy line segments 306B in dummy line zone 312C have a first dummy line width C3. Dummy line width C1, dummy line width C2, and dummy line width C3 range from about 0.1 μm to about 1 μm. For dummy line widths smaller than about 0.1 μm, loading effects during an etch process result in incomplete etching of the line to expose the underlying isolation structure, in some instance. For dummy line widths larger than about 1 μm, the amount of dielectric material between dummy line segments and conductive line segments is reduced and dielectric breakdown is more likely, in some instances. In some embodiments, the dummy line widths in all of the dummy line zones are the same dummy line width. In some embodiments, the dummy line width of dummy lines in each dummy line zone are different from each other. In some embodiments, the center dummy line width (In embodiments having an odd number of dummy line segments) is larger than the edge dummy line width of dummy line segments closer to line segments which are over a doped zone of the semiconductor device. In some embodiments, the center dummy line width is smaller than the edge dummy line width of dummy line segments closer to line segments which are over a doped zone of the semiconductor device.

Trim region 309A has a first trim region width S2a. Trim region 309B has a second trim region width S2b. Trim region 309C has a third trim region width S2c. Trim region 309D has a fourth trim region width S2d. Trim region 309E has a fifth trim region width S2e. Trim region 309F has a sixth trim region width S2f. In some embodiments, trim region width range from about 0.01 µm to about 0.1 µm (e.g., 0.01 µm<S2a<0.01 µm, and so forth). In some embodiments, trim region widths smaller than about 0.01 µm are associated with higher likelihood of dielectric breakdown during semiconductor device operation. In some embodiments, trim region widths larger than about 0.1 µm are not known to provide additional benefit with regard to reducing likelihood of dielectric breakdown. In some embodiments, the trim region widths S2a-S2e are the same trim region width. In some embodiments, the trim region widths S2a-S2e are all different trim region widths. In some embodiments, the trim region widths closest to the ESD device areas are larger than trim region widths which are separated from the ESD device area by at least one dummy line segment (e.g., S2c and S2d are larger than S2a, S2b, S2e, and S2f). In some embodiments, the trim region widths closest to the ESD device areas are larger than trim region widths which are separated from the ESD device area by at least one dummy line segment because the larger dimension of dielectric material reduces a likelihood of dielectric breakdown in a semiconductor device. In some embodiments, the trim region widths closest to the ESD device areas are smaller than trim region widths which are separated from the ESD device area by at least one dummy line segment (e.g., S2c and S2d are smaller than S2a, S2b, S2e, and S2f). In some embodiments, the trim region widths closest to the ESD device areas are smaller than trim region widths which are separated from the ESD device area by at least one dummy line segment because the semiconductor device operates a low operating voltage.

Line segments 306A and 306C, and dummy line segments 306B include a second semiconductor material which has been etched into lines extending along the first direction 398 of semiconductor device 300. In some embodiments, the line segments and dummy line segments include the same semiconductor material as a gate electrode of a transistor in a separate region of the semiconductor device. In some embodiments, the line segments and the dummy line segments and the gate electrodes extend together in the first direction 398. In some embodiments, the line segments and the dummy line segments extend in a different direction than the gate electrodes of a semiconductor device.

Trim regions 309A and 309B are at either end of the line segments 306A over ESD device area 302B, along the first direction 398. Trim regions 309E and 309F are at either end of the line segments 306C over ESD device area 302D, along the first direction 398. Trim regions 309B, 309C, 309D, and 309E are at the ends of the dummy line segments 306B of semiconductor device 300 over isolation structure 304.

Figure 4:
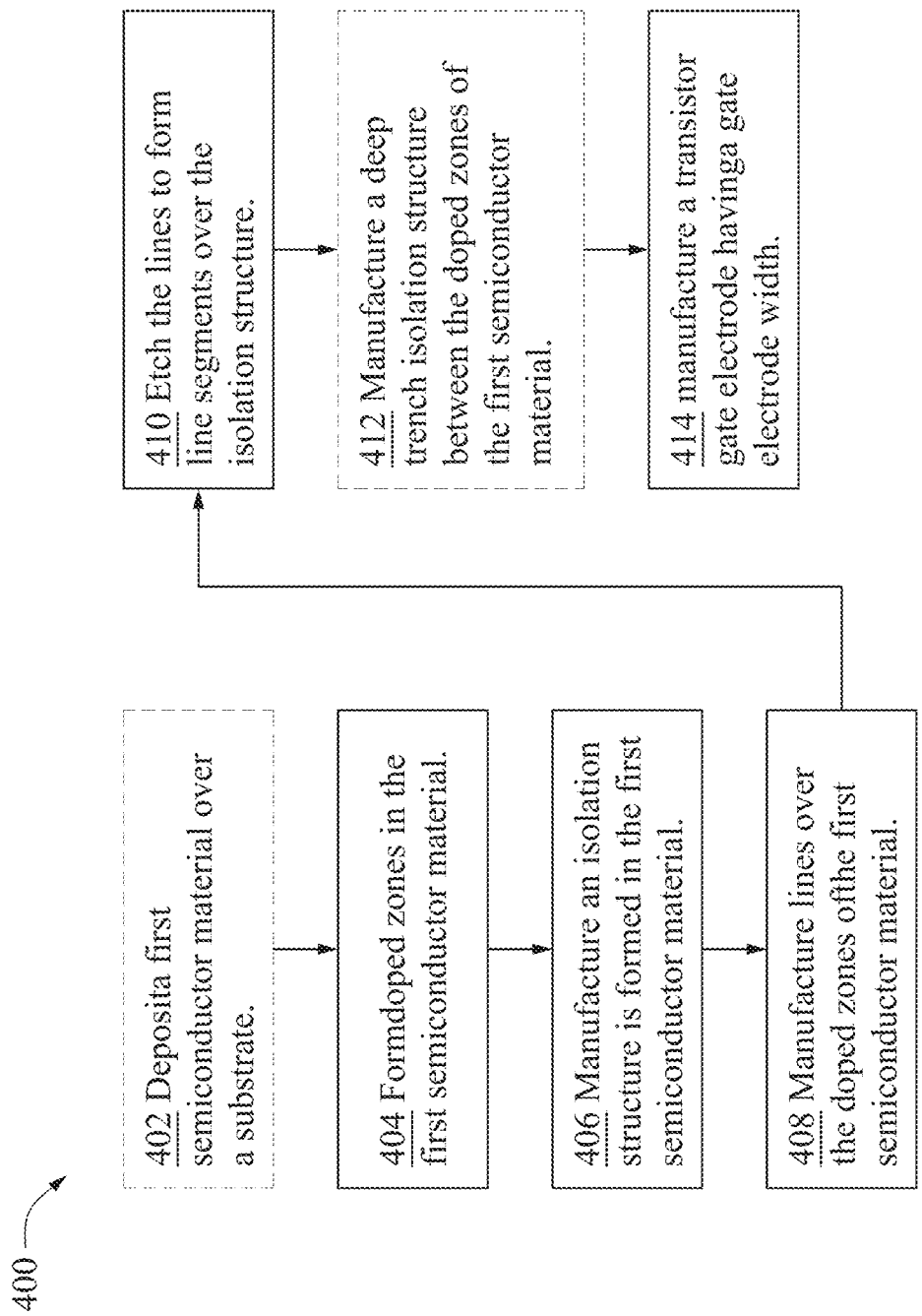
FIG. 4 is a flow diagram of a method of making a semiconductor device, in accordance with some embodiments.

ESD device areas 302B and 302D have an ESD device area width W1 extending in the first direction 398, and an ESD device area length (L, not shown) extending in the second direction 399. Line segments 306A have a line segment width W1 extending in the first direction, and a line segment width extending in the second direction FIG. 4 is a flow diagram of a method 400 of making a semiconductor device, in accordance with some embodiments.

In some embodiments, method 400 includes an optional operation 402, in which a first semiconductor material is deposited over a substrate. In some embodiments, the substrate is a semiconductor material and the method proceeds by treating and modifying the substrate directly. In some embodiments, the substrate is a base semiconductor material or a dielectric material onto which the first semiconductor material is deposited for subsequent operations in performing method 400. In some embodiments, the substrate is a dielectric material and the semiconductor device is formed in a silicon-on-insulator (SOI) device integration scheme. In some embodiments, the substrate is a doped semiconductor material (e.g., a P-doped semiconductor material), and the first semiconductor material is deposited with a same-type dopant (e.g., P-doped substrate and P-doped first semiconductor material) over the substrate. In some embodiments, the substrate is a doped semiconductor material (e.g., a P-doped semiconductor material), and the first semiconductor material is deposited with a different-type dopant over the substrate (e.g., P-doped substrate and N-doped first semiconductor material). According to some embodiments, the first semiconductor material is deposited over the substrate by a chemical vapor deposition (CVD) process. In some embodiments, the first semiconductor material is deposited over the substrate by a physical vapor deposition (PVD) process (e.g., a sputtering process). In some embodiments, the first semiconductor material is deposited over the substrate by an atomic layer deposition (ALD) process. In some embodiments, the first semiconductor material is deposited with a thickness of at least 50 nm in order to allow for formation of doped zones in the first semiconductor material after an implant process to form doped zones in the first semiconductor material (e.g., doped zones for the ESD device areas), and so forth.

Method 400 includes an operation 404, in which doped zones are formed in the first semiconductor material. In FIG. 3, doped zones 303B and 303D are examples of doped zones formed in a first semiconductor material. In some embodiments, doped zones are formed by performing an implant process into the first semiconductor material through openings in a mask layer deposited over the first semiconductor material. In some embodiments, the doped zones are formed by depositing a blanket layer of dopant material, depositing a patterning material over the blanket layer of dopant material, transferring a pattern to the patterning material, and removing part of the blanket layer of dopant material to leave a patterned dopant material on the top surface of the first semiconductor material. In some embodiments, the dopants are added to the first semiconductor material by, e.g., performing an anneal process to interdiffuse the patterned dopant material and the first semiconductor material resulting in a pattern of dopants in the first semiconductor material corresponding to the arrangement of the patterned dopant material.

In some embodiments, the doped zones include N-type dopants and the first semiconductor material is undoped. In some embodiments, the doped zones include P-type dopants and the first semiconductor material is undoped. In some embodiments, forming the doped zones creates a PN junction at the interface between the doped zone and an unmodified portion of the first semiconductor material below the doped zones. The PN junction formed by adding dopants to form the doped zones results in a resistance to current flowing through the ESD device until a threshold voltage or a threshold current is reached by the semiconductor device.

Method 400 includes an operation 406, in which isolation structures are formed in the first semiconductor material. In some embodiments, the isolation structures are dielectric material deposited into openings etched into the first semiconductor material. In some embodiments, the isolation structure comprises silicon dioxide, spin-on-glass, or some other dielectric material compatible with a front end of line (FEOL) integration scheme.

Method 400 includes an operation 408, in which lines of a second semiconductor material are manufactured over the isolation structure and over the first semiconductor material. Method 400 also includes an operation 410, in which the second semiconductor material is etched in order to form line segments of the lines of the second semiconductor material. In some embodiments, operations 408 and 410 are performed separately, and lines of second semiconductor material formed during operation 408 are trimmed in operation 410 to form line segments/semiconductor device transistor gate electrodes. In some embodiments, operations 408 and 410 are performed in a single cycle of patterning and etching to form line segments for the ESD device areas and gate electrodes for the semiconductor device transistors. In embodiments of method 400 where operations 408 and 410 are performed separately, the processes described below for operation 408 are repeated for operation 410 at a separate time in the manufacturing flow.

In operation 408, manufacturing lines of the second semiconductor material includes steps related to depositing a blanket layer of the second semiconductor material, depositing a layer of patterning material, transferring a pattern to the layer of patterning material, and etching the second semiconductor material to form the lines of second semiconductor material. In operation 410, trimming the lines of second semiconductor material also includes steps related to depositing a blanket layer of the second semiconductor material, depositing a layer of patterning material, transferring a pattern to the layer of patterning material, and etching the second semiconductor material to form the line segments. In embodiments of method 400 where operations 408 and 410 are performed in a single operation, the pattern transferred to the layer of patterning material is a pattern with line segments, therein, and the breaks in the lines corresponding to the position of trim regions (see trim regions 109 in FIG. 1, above).

In some embodiments, depositing a blanket layer of the second semiconductor material includes performing a sputtering process to form the blanket layer of the second semiconductor material. In some embodiments, depositing a blanket layer of the second semiconductor material includes performing a chemical vapor deposition process to form the blanket layer of the second semiconductor material. In some embodiments, depositing a blanket layer of the second semiconductor material includes performing an atomic layer deposition (ALD) process to form the blanket layer of the second semiconductor material. In some embodiments, the second semiconductor material is the same as the first semiconductor material. In some embodiments, the second semiconductor material is different from the first semiconductor material. In some embodiments, the second semiconductor material comprises silicon. In some embodiments, the second semiconductor material is a same material as the gate electrode for a transistor of the semiconductor device.

In some embodiments, depositing a layer of patterning material over the second semiconductor material includes steps associated with depositing a layer of photoresist, depositing a layer of ultra-violet lithography patterning material, or depositing any other patterning material compatible with a semiconductor device manufacturing process.

In some embodiments, transferring a pattern to the layer of patterning material includes steps associated with performing an immersion lithography process, an ultraviolet lithography process, or any other pattern transfer process compatible with a FEOL level of a semiconductor device integration scheme. In some embodiments, transferring a pattern to the layer of patterning material includes steps associated with developing the layer of patterning material to remove a portion of the patterning material and expose the top surface of the second semiconductor material. In some embodiments, the pattern transferred to the layer of patterning material comprises a set of parallel or perpendicular patterning material lines extending over ESD device areas and over the transistor active areas of the semiconductor device. In some embodiments, the patterning material lines in the ESD device areas and the transistor active areas of the semiconductor device have a same patterning line width.

In some embodiments, the line segments of the second semiconductor material in the ESD device areas and the transistor active areas of the semiconductor device have a same line width (e.g., the direction across the line segment/ gate electrode). Line segments of the second semiconductor material are formed by performing one or more etch processes, as described below, and exposing [1] the isolation structure below the second semiconductor material, and [2] the first semiconductor material below the second semiconductor material in trim regions (see, e.g., trim region 109 in FIG. 1).

In some embodiments, etching the second semiconductor material is performed by a plasma etch process. In some embodiments, etching the second semiconductor material is by a liquid etch process. In some embodiments, etching the second semiconductor material is by a combination of plasma etch and liquid etch processes. In some embodiments, a portion of the patterning material is removed from the second semiconductor material by an initial plasma etch process, and a liquid etch process is performed to remove a remainder of the patterning material. In some embodiments, a portion of the patterning material is removed from the second semiconductor material by an initial plasma etch process, and an ash process or strip process is performed to remove a remainder of the patterning material from the lines of the second semiconductor material. In some embodiments, a liquid etch process is performed in order to remove residual surface oxide which has formed on the surface of the second semiconductor material.

In some embodiments, method 400 includes an optional operation 412, in which a trench isolation structure is manufactured extending deep into the first semiconductor material. For example, trench isolation structure 719A of FIG. 7 extends into first semiconductor material 702 between doped zone 703A and doped zone 703B. A trench isolation structure reduces the capacitance between ESD device areas and of the ESD device as a whole. For example, in a semiconductor device where all the ESD device areas are separated by trench isolation structures the parasitic capacitance of the ESD devices is about 30% smaller than in a similar device without trench isolation structures A trench isolation structure is manufactured in the first semiconductor material by performing a step of depositing a layer of patterning material over the isolation structure and the first semiconductor material. In embodiments of method 400 in which the ESD device areas are manufactured before the trench isolation structures, the layer of patterning material also covers the first semiconductor material (see doped zone 703A in first semiconductor material 702 of FIG. 7).

A pattern is transferred to the layer of patterning material, wherein the pattern has openings which have a major axis extending along the first direction (e.g., in parallel to the major axis of the ESD device areas), and a minor axis extending along the second direction (see second direction 799 of FIG. 7). In some embodiments, the pattern transfer is an immersion photolithography process. In some embodiments, the pattern transfer is an ultraviolet pattern transfer process. In some embodiments, the pattern transfer is another type of lithography or any other pattern transfer process to the semiconductor device to create openings along the sides of the ESD device areas.

An etch process is performed in order to create an opening along at least one ESD device area. In some embodiments, the etch process is an anisotropic plasma etch process. In some embodiments, the etch process creates an opening extending below the bottom edge of the ESD device area. In some embodiments, the etch process creates an opening extending below the bottom edge of the isolation structure (see isolation structure 704 of FIG. 7). In some embodiments, the etch process creates an opening extending down to the substrate below the first semiconductor material (see, e.g., substrate 701 of FIG. 7).

The opening formed along a side of the at least one ESD device area is filled with a dielectric material to create the trench isolation structure. In some embodiments, the opening is first lined with a liner material such silicon nitride. In some embodiments, the opening is filled with a dielectric material such as silicon dioxide. In some embodiments, the trench isolation structure dielectric material is the same as the dielectric material of the isolation structure (see isolation structure 704). In some embodiments, the trench isolation structure dielectric material is different from the isolation structure dielectric material. The dielectric material is deposited into the opening by, e.g., a chemical vapor deposition process, an ALD process, or a similar process which is able to fill the opening without voids or defects.

Method 400 includes an operation 414, in which a transistor gate electrode is formed over a transistor active area of the semiconductor device. In some embodiments, the transistor gate electrode is formed in a same step as the formation of the lines, or the line segments, over the ESD device areas (e.g., in some embodiments, operation 408 and operation 414 are performed simultaneously, or operations 408, 410, and 414 are performed simultaneously). In some embodiments, operations 408, 410, and 414 are performed separately in order to provide additional protection for the ESD device areas, and/or the transistor areas, during manufacture of other areas of the semiconductor device. For example, ESD device area manufacture may be separate from the transistor gate electrode manufacture because implant processes associated with manufacturing of the source/drain regions (SD regions) are prone to contaminate the ESD device area, reducing the ESD device effectiveness at directing current around the semiconductor device during an ESD transient event (e.g., high voltage and/or high current conditions for the semiconductor device).

Steps associated with the manufacture of a transistor gate electrode are similar to the steps described above for manufacturing lines, or line segments, over an ESD device area: deposition of a layer of semiconductor material (e.g., second semiconductor material), depositing a layer of patterning material, transferring a pattern to the layer of patterning material, and etching the semiconductor material to form the transistor gate electrodes.

FIG. 5 is a cross-sectional view of a semiconductor device 500, in accordance with some embodiments. Elements of semiconductor device 500 which have a similar structure and function as elements of semiconductor device 100 have a same identifying numeral, incremented by 400. Elements of semiconductor device 500 which have a similar structure and function as elements of semiconductor device 200 have a same identifying numeral, incremented by 300.

In semiconductor device 500, first semiconductor material 502 is over substrate 501, and ESD device areas 502A and 502C extend from the top surface of first semiconductor material 502 down along the sides of isolation structures 504. In some embodiments, first semiconductor material 502 comprises, silicon, silicon germanium, gallium arsenide, or some other semiconductor material suitable for FEOL integration schemes. In some embodiments, the ESD device areas 502A and 502C include doped zones 503 of the first semiconductor material 502. Line segment 506A is in line segment zone 510A and extends over ESD device area 502A. Line segment 506C is in line segment zone 510C and extends over ESD device area 502C. Dummy line segment 506B is in dummy line zone 512C and extends over isolation structure 504 between ESD device area 502A and ESD device area 502C. Line segments 506A and 506C have a line segment width W2. Dummy line segment 506B in dummy line segment zone 512C has a dummy line segment width C. Trim regions of the semiconductor device 500 have a trim region width S2 between line segments 506A and 506C, and dummy line segment 506B. In some embodiments, the trim region widths are all different above the isolation structures.

Trim regions 509A-509D are adjacent to line segments and dummy line segments of semiconductor device 500 as follows: trim region 509A and dielectric material 508A are at an opposite end of line segment 506A from trim region 509B and dielectric material 508B; trim region 509B and dielectric material 508B are at an opposite end of dummy line segment 506B from trim region 509C and dielectric material 508C; and trim region 509D and dielectric material 508D are at an opposite end of line segment 506C from trim region 509C and dielectric material 508C. In some embodiments, dielectric material 508A-508D is silicon dioxide, silicon nitride, silicon oxy-nitride, or some other FEOL-compatible dielectric material. In some embodiments, the dielectric material between line segments is a low-k dielectric material to reduce parasitic capacitance in the ESD device area and to increase the responsiveness of the ESD device to high voltage or high current conditions applied to the semiconductor device.

A dummy line segment 506B is included in semiconductor device 500 because for some operating voltages (e.g., for some operating voltages larger than 1.32 V), the breakdown voltage of the dielectric material between line segments (see, e.g., line segments 106A and 106C in FIG. 1) is smaller than the operating voltage of the semiconductor device. Thus, the manufacture of a dummy line segment creates two portions of dielectric material between line segments electrically connected to ESD device areas, and the risk of dielectric breakdown in the ESD device is significantly reduced. Further, parasitic capacitance of the ESD device is reduced by trimming the line segments 506A and 506C closer to the edges of the ESD device areas (502A and 502C) adjacent to isolation structure 504 between the ESD device areas. By reducing the parasitic capacitance of the ESD device structures (e.g., the parasitic capacitance of the line segments across isolation structure 504 and to first semiconductor material), the speed with which the ESD devices respond to the conditions of high voltage and/or high current applied to the semiconductor device decreases, reducing the likelihood of damage to the semiconductor device.

FIG. 6 is a cross-sectional view of a semiconductor device 600, in accordance with some embodiments. Elements of semiconductor device 600 which have a same function and/or structure as an element of semiconductor device 500 have a same identifying numeral, incremented by 100.

In semiconductor device 600, first semiconductor material 602 is over substrate 601, and includes ESD device area 602A and ESD device area 602C. ESD device area 602A includes doped zone 603A, and ESD device area 602C includes doped zone 603C.

Line segment 606A is over ESD device area 602A, and line segment 606C is over ESD device area 602C. Isolation structure 604 is between ESD device area 602A and ESD device area 602C. Dummy line segments 606B1, 606B2, 606B3, and 606B4 are over isolation structure 604 between line segments 606A and 606C. Trim regions 609A-609G are adjacent to line segments and dummy line segments of semiconductor device 600 as follows: trim region 609A and dielectric material 608A are at an opposite end of line segment 606A from trim region 609B and dielectric material 608B; trim region 609B and dielectric material 608B are at an opposite end of dummy line segment 606B1 from trim region 609C and dielectric material 608C; trim region 609C and dielectric material 608C are at an opposite end of dummy line segment 606B2 from trim region 609D and dielectric material 608D; trim region 609D and dielectric material 608D are at an opposite end of dummy line segment 606B3 from trim region 609E and dielectric material 608E; trim region 609E and dielectric material 608E are at an opposite end of dummy line segment 606B4 from trim region 609F and dielectric material 608F; and trim region 609F and dielectric material 608F are at an opposite end of line segment 606G from trim region 609C and dielectric material 608G.

Trim region 609A has a trim region width S2$a$, trim region 609B has a trim region width S2$b$, trim region 609C has a trim region width S2$c$, trim region 609D has a trim region width S2$d$, trim region 609E has a trim region width S2$e$, trim region 609F has a trim region width S2$f$, and trim region 609G has a trim region width S2$g$.

Line segments 606A and 606C have a line segment width W2 along the first direction 698. Line segment width W2 ranges from about 0.01 μm to about 1.0 μm. For values of W2 smaller than about 0.01 μm, patterning problems contribute significantly to noise and errors in device performance. For values of W2 larger than about 1.0 μm, die area becomes large without an increasing benefit in the performance of the device.

Dummy line segments 606B1-606B4 have a dummy line segment width C1 ranging from about 0.1 μm to about 1.0 μm. Values of the dummy line segment width less than 0.1 μm result in patterning issues and etch uniformity problems during a manufacturing process of the semiconductor device. Dummy line segment widths greater than 1.0 μm result in the ends of line segments of the semiconductor device terminating over the first semiconductor material rather than the isolation structure, reducing the current-carrying capacity of the ESD devices of the semiconductor device.

FIG. 7 is a cross-sectional view of a semiconductor device 700, in accordance with some embodiments. Features and elements of semiconductor device 700 which have a same structure and/or function as semiconductor device 100 have a same identifying numeral, incremented by 600. In semiconductor device 700, a first semiconductor material 702 is over a substrate 701. In some embodiments, first semiconductor material 702 comprises silicon, silicon germanium, gallium arsenide, or another semiconductor material compatible with a source/drain region (SD region) of a semiconductor device. In some embodiments, substrates such as substrate 701 include semiconductor substrates, dielectric substrates, or other materials on which an ESD device or a transistor region of a semiconductor device is manufactured. Isolation structures 704 have a top surface substantially coplanar with the top surface of first semiconductor material 702. Isolation structures 704 are recessed into first semiconductor material 702 below the bottom edge of doped zones 703A, 703B, 703C, 703D, 703E, and 703F. ESD device area 702A includes doped zones 703A-703D of first semiconductor material 702 which have a same type of dopant added thereto. ESD device area 702B includes doped zones 703E-703F of first semiconductor material 702 which have a same type of dopant added thereto. In some embodiments, the doped zones 703A-703D and the doped zones 703E-703F have a same dopant type (e.g., N-type or P-type dopants). In some embodiments, doped zones 703A-703D have a first type of dopant added thereto, and doped zones 703E-703F have a second type of dopant added thereto, wherein the second type of dopant is different from the first type of dopant (e.g., N-type vs. P-type).

Trench isolation structures 719A, 719B, and 719C are located in first semiconductor material 702. Trench isolation structures 719A and 719B are in ESD device area 702A, and Trench isolation structure 719C is in ESD device area 702B. Trench isolation structures 719A-719C extend part-way through first semiconductor material 702. In some embodiments, trench isolation structures extend fully through the first semiconductor material and are against the substrate below the first semiconductor material.

Trench isolation structures are dielectric material barriers which electrically isolate an adjacent doped zone in a first semiconductor material from adjacent structures in the first semiconductor material. For example, in ESD device area 702A, trench isolation structure 719A is between doped zone 703A and doped 703B, and trench isolation structure 719B is between doped zone 703C and doped 703D. There is no trench isolation structure between doped zone 703B and doped zone 703C. In ESD device area 702A, the four doped zones 703A-703D have 5 corresponding trench isolation structures: two "end" locations, between a doped zone (doped zone 703A and doped zone 703F) and the isolation structure 704, and three "inner" locations (between two of the four doped zones). Thus, in ESD device area 702A, the trench isolation structure density is 40% (e.g., 2 of the 5 locations for a trench isolation structure have a trench isolation structure). In ESD devices described herein, a trench isolation structure density ranges from 0% (see semiconductor device 100) to 100%. The number of trench isolation structures in an ESD device area is adjusted at a design phase of the semiconductor device manufacturing process, according to calculations of the parasitic capacitance of the ESD devices, the response time (Rory) of the ESD devices to a high current or high voltage, and other activation factors. By increasing the number of trench isolation structures in the ESD device areas, the current carrying capacity of an ESD device is increased, as compared to a semiconductor device with ESD device areas which do not have trench isolation structures, for the same applied voltage. See FIG. 8, below.

FIG. 7 includes a plurality of vias 717 electrically connected to doped zones 703A-703F of the semiconductor device 700, and a plurality of interconnects comprising contacts 713 and conductive pillars 715 (or, conductive lines) directly against the top surface of first semiconductor material 702. Contacts 713 and vias 717 are electrically connected to ESD device rails 711A and 711B to conduct current out of/into the ESD device during operation of the semiconductor device 700.

Figure 8:
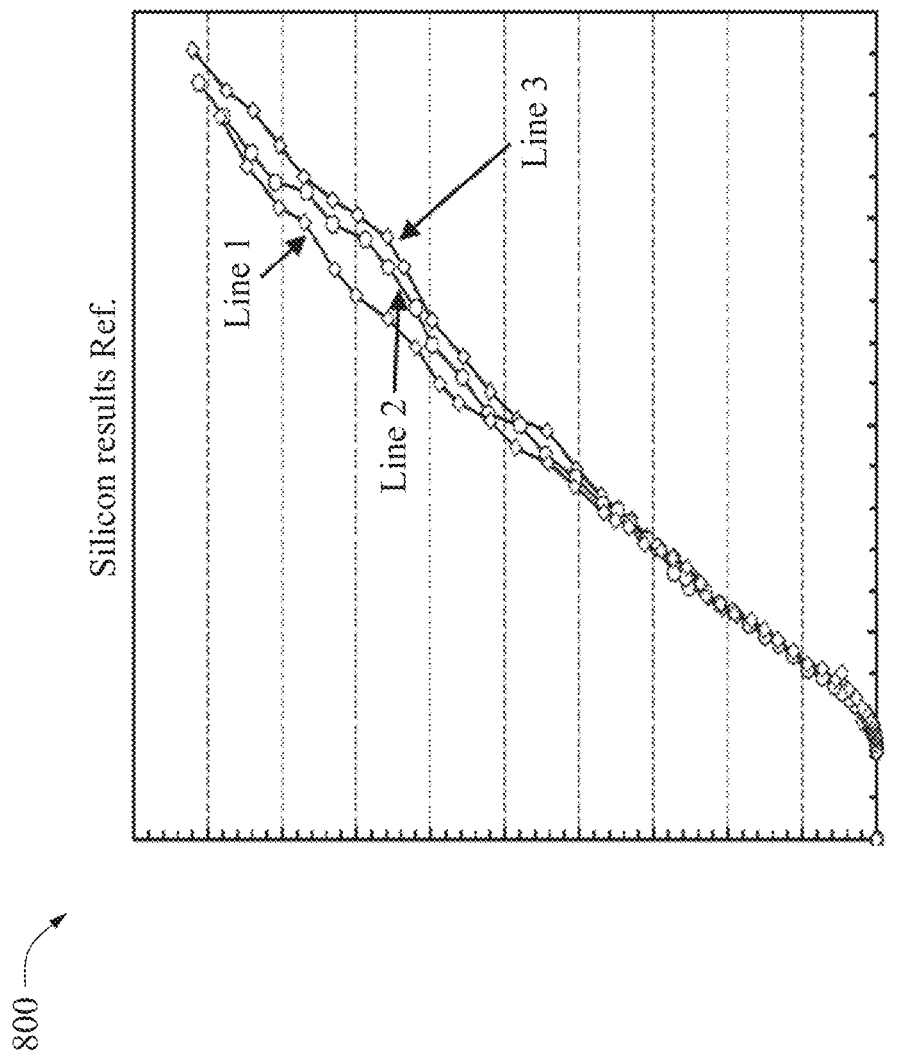
FIG. 8 is a graph of ESD performance parameters devices, in accordance with some embodiments.

FIG. 8 is a graph 800 of ESD performance parameters devices, in accordance with some embodiments. The vertical axis of graph 800 represents current-carrying capacity (I) of an ESD device and the horizontal axis of graph 800 represents the voltage (V) applied to the ESD device. $R_{ON}$ of an ESD device is the threshold resistance of an ESD device to current flowing through the ESD device. In graph 800: Line 1 (top, diamond shapes) is the I/V plot an ESD device as described above where the ESD device line segments and the transistor gate electrodes have a same lateral dimension (e.g., line length); Line 2 (middle, circles) is the I/V plot of an ESD device as described above where the ESD device line segments have a lateral dimension of 55 nanometers and a single oxide layer in the transistor region, and the transistor gate electrode has a lateral dimension smaller than 55 nm; and Line 3 (bottom, diamonds) is the I/V plot of an ESD device as described above where the ESD device line segments have a lateral dimension of 55 nanometers and a thick oxide layer in the transistor region, and the transistor gate electrode has a lateral dimension smaller than 55 nm.

ESD devices manufactured according to the present disclosure, and having a line segment directly over a doped zone of the first semiconductor material, have are able to operate without an exclusion zone between the ESD device areas and other semiconductor circuit elements, and have smaller $R_{ON}$ values than ESD devices manufactured with different configurations.

Figure 9:
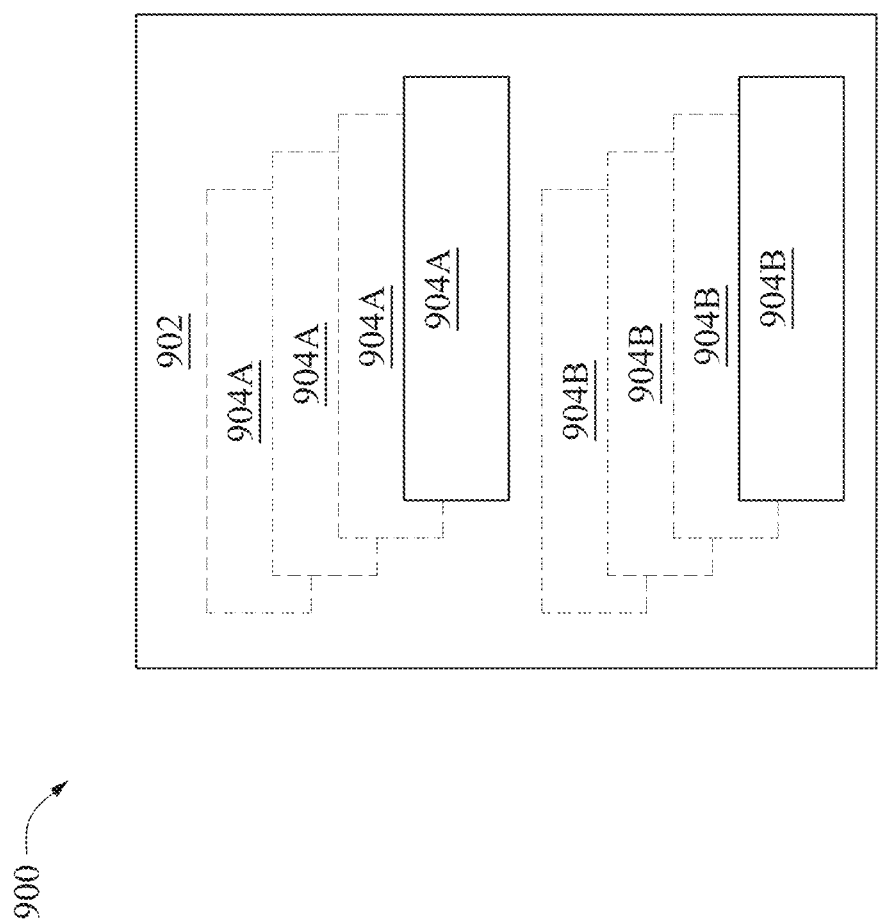
FIG. 9 is a block diagram of a semiconductor device in accordance with some embodiments.

FIG. 9 is a block diagram of a semiconductor device 900 in accordance with at least one embodiment of the present disclosure.

In FIG. 9, semiconductor device 900 includes, among other things, a circuit macro (hereinafter, macro) 902. In some embodiments, macro 902 is an ESD device macro. Macro 902 includes, among other things, a wire routing arrangement 904A-904B.

Example of layout diagrams resulting in wire routing arrangement 904 include the routing arrangement layout diagrams in FIG. 2, as described above.

Figure 10:
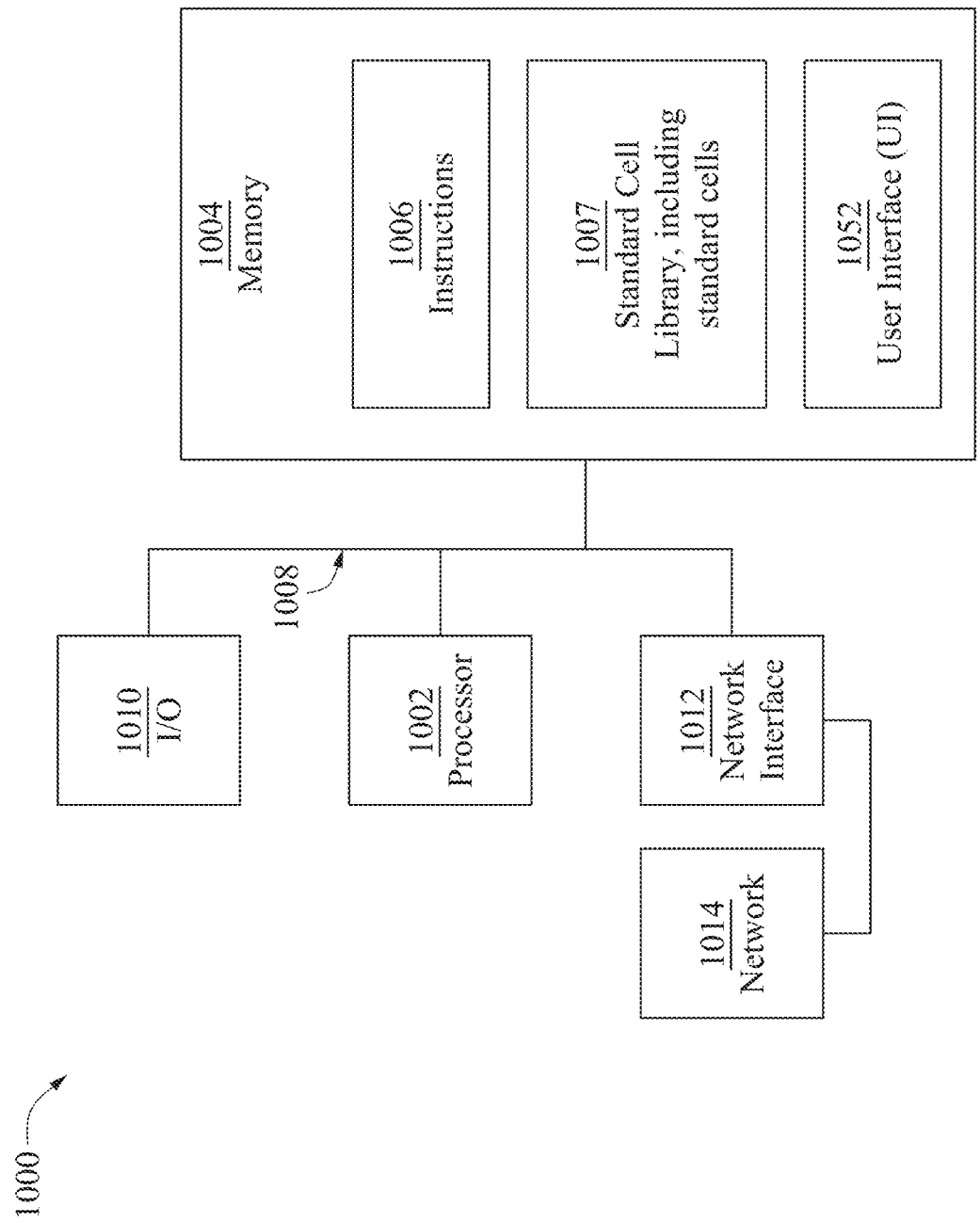
FIG. 10 is a block diagram of an electronic design automation (EDA) system in accordance with some embodiments.

FIG. 10 is a block diagram of an electronic design automation (EDA) system 1000 in accordance with some embodiments.

In some embodiments, EDA system 1000 includes an APR system. Methods described herein of designing layout diagrams represent wire routing arrangements, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, e.g., a set of executable instructions (instructions). Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1052.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
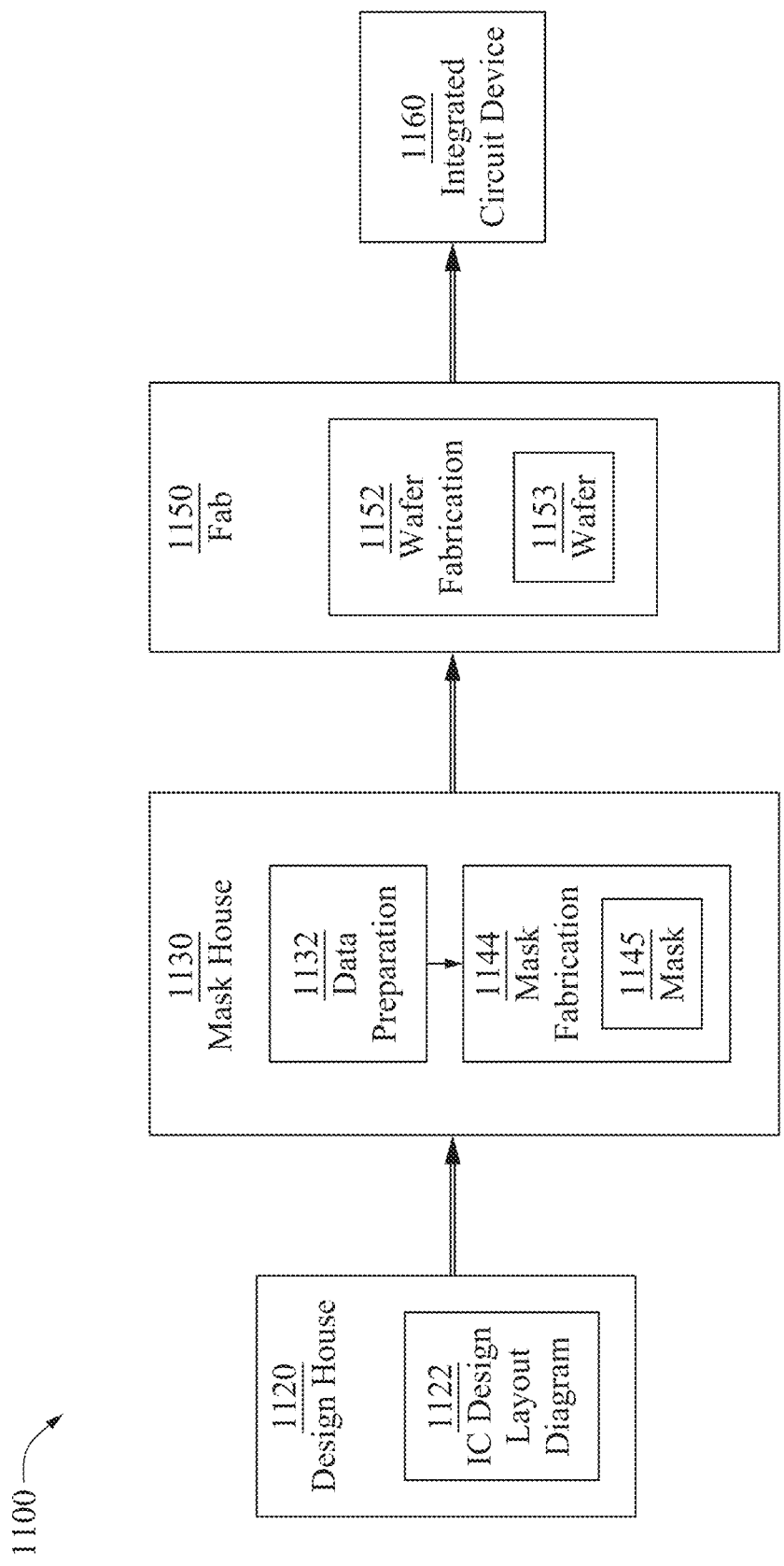
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

Aspects of the present disclosure relate to a semiconductor device which includes a first doped zone and a second doped zone in a first semiconductor material, the first doped zone being separated from the second doped zone; an isolation structure between the first doped zone to the second doped zone; a first line segment over a top surface of the first doped zone, wherein the first line segment has a first end over a first portion of the isolation structure, and a second end over a second portion of the isolation structure; a second line segment over a top surface of the second doped zone, wherein the second line segment has a third end over a third portion of the isolation structure, and a fourth end over a fourth portion of the isolation structure, wherein the first line segment and the second line segment have a first width; and a dielectric material between the first line segment and the second line segment and over the isolation structure. In some embodiments, the semiconductor device further includes a transistor having a gate electrode with a gate electrode width, wherein the gate electrode width is substantially similar to the first width. In some embodiments of the semiconductor device, the first line segment and the second line segment further include a second semiconductor material. In some embodiments, the semiconductor device further includes a first dummy line segment between the first line segment and the second line segment, and over the isolation structure between the first doped zone and the second doped zone, wherein the dielectric material is between the first dummy line segment and the first line segment, and between the first dummy line segment and the second line segment. In some embodiments, the semiconductor device further includes a second dummy line segment between the first dummy line segment and the second line segment, wherein the second dummy line segment is over the isolation structure, and the dielectric material is between the second dummy line segment and the first dummy line segment, and between the second dummy line segment and the second line segment. In some embodiments, the first doped zone has a first type of dopant and the second doped zone has the first type of dopant. In some embodiments, the first doped zone has an N-type dopant, and the second doped zone has a P-type dopant.

Aspects of the present disclosure relate to a method of making a semiconductor device, including operations of manufacturing doped zones in a first semiconductor material over a substrate; forming an isolation structure between the doped zones of the first semiconductor material; manufacturing lines extending in a first direction over the doped zones of the first semiconductor material, the lines having a line width measured along a second direction perpendicular to the first direction; trimming the lines into line segments having ends over the isolation structure; and etching a transistor gate electrode over the substrate, wherein transistor gate electrode has a gate electrode width measured along the second direction, and wherein the line width is substantially similar to the gate electrode width. In some embodiments of the method, manufacturing doped zones further includes performing an implant process to add dopant atoms to the first semiconductor material. In some embodiments of the method, manufacturing doped zones further includes: depositing a layer of dopant atom material to a top surface of the first semiconductor material; removing a portion of the layer of dopant atom material form the top surface of the first semiconductor material; and annealing the semiconductor device to drive the dopant atom material into the first semiconductor material. In some embodiments of the method, forming an isolation structure between the doped zones of the first semiconductor material further includes: etching the first semiconductor material to form pillars at locations of the doped zones; and depositing an isolation structure material against sidewalls of the pillars and over a top surface of the first semiconductor material. Some embodiments of the method include exposing a top surface of the pillars. In some embodiments of the method, manufacturing lines extending in a first direction over the doped zones of the first semiconductor material further includes: depositing a second semiconductor material over the isolation structure and the doped zones of the first semiconductor material; depositing a layer of patterning material over the second semiconductor material; transferring a pattern to the layer of patterning material; and etching the second semiconductor material through openings in the layer of patterning material to have the pattern. In some embodiments of the method, etching the second semiconductor material through openings in the layer of patterning material includes etching the lines to have ends over the isolation structure. In some embodiments of the method, etching the second semiconductor material through openings in the layer of patterning material includes etching the transistor gate electrode over the substrate.

Aspects of the present disclosure relate to a semiconductor device, which includes a first doped zone and a second doped zone in a first semiconductor material, wherein the first doped zone is separated from the second doped zone, and wherein the first doped zone and the second doped zone each extend in a first direction, and have a width extending in a second direction perpendicular to the first direction; an isolation structure over the first semiconductor material and extending around the first doped zone and the second doped zone; a first line segment extending in the first direction over the first doped zone and a second line segment, aligned with the first line segment, extending in the first direction over the second doped zone, wherein the first line segment and the second line segment have a line width measured in the second direction; and a dielectric material between the first line segment and the second line segment. In some embodiments, the semiconductor device further includes a transistor having a gate electrode with a gate electrode width, wherein the gate electrode width is substantially similar to the line width. In some embodiments of the semiconductor device the gate electrode, the first line segment, and the second line segment include a second semiconductor material. In some embodiments, the semiconductor device further includes a dummy line segment between the first line segment and the second line segment and over the isolation structure, wherein the dielectric material is between the first line segment and the dummy line segment, and between the second line segment and the dummy line segment. In some embodiments, the semiconductor device further includes a trench isolation structure adjacent to the first doped zone and laterally separated from the first doped zone in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first doped zone and a second doped zone in a first semiconductor material;
an isolation structure between the first doped zone to the second doped zone;
a first line segment directly against a top surface of the first doped zone, wherein the first line segment has a first end over a first portion of the isolation structure, and a second end over a second portion of the isolation structure;
a second line segment over a top surface of the second doped zone, wherein the second line segment has a third end over a third portion of the isolation structure, and a fourth end over a fourth portion of the isolation structure, wherein the first line segment and the second line segment have a first width; and
a dielectric material between the first line segment and the second line segment and over the isolation structure.

2. The semiconductor device of claim 1, further comprising a transistor having a gate electrode with a gate electrode width, wherein the gate electrode width has the first width.

3. The semiconductor device of claim 1, wherein the first line segment and the second line segment comprise a second semiconductor material.

4. The semiconductor device of claim 1, further comprising a first dummy line segment between the first line and the second line, and over the isolation structure, wherein the dielectric material is between the first dummy line segment and the first line segment, and between the first dummy line segment and the second line segment.

5. The semiconductor device of claim 4, further comprising a second dummy line segment between the first dummy line segment and the second line segment, wherein the second dummy line segment is over the isolation structure, and the dielectric material is between the second dummy line segment and the first dummy line segment and the second dummy line segment, and between the second dummy line segment and the second line segment.

6. The semiconductor device of claim 1, wherein the first doped zone has a first type of dopant and the second doped zone has the first type of dopant.

7. The semiconductor device of claim 1, wherein the first doped zone has an N-type dopant, and the second doped zone has a P-type dopant.

8. A semiconductor device, comprising:
a first doped zone and a second doped zone in a first semiconductor material, wherein the first doped zone and the second doped zone each extend in a first direction and have a width extending in a second direction perpendicular to the first direction;
an isolation structure over the first semiconductor material and extending around the first doped zone and the second doped zone;

a first line segment extending in the first direction over the first doped zone and a second line segment, aligned with the first line, extending in the first direction over the second doped zone, wherein the first line segment and the second line segment have a line width measured in the second direction; and a dielectric material between the first line segment and the second line segment.

9. The semiconductor device of claim 8, further comprising a transistor having a gate electrode with a gate electrode width, wherein the gate electrode width is substantially similar to the line width.

10. The semiconductor device of claim 9, wherein the gate electrode, the first line segment, and the second line segment comprise a second semiconductor material.

11. The semiconductor device of claim 8, further comprising a dummy line segment between the first line segment and the second line segment and over the isolation structure, wherein the dielectric material is between the first line segment and the dummy line segment, and between the second line segment and the dummy line segment.

12. The semiconductor device of claim 8, further comprising a trench isolation structure adjacent to the first doped zone and laterally separated from the first doped zone in the second direction.

13. A semiconductor device, comprising:
a first doped zone in a first semiconductor material;
a second doped zone in the first semiconductor material;
an isolation structure between the first doped zone to the second doped zone;
a first line segment directly on a top surface of the first doped zone, wherein a width of the first line segment is greater than a width of the first doped zone, and the first line segment overlaps the isolation structure;
a second line segment directly on a top surface of the second doped zone, wherein a width of the second line segment is greater than a width of the second doped zone, and the second line segment overlaps the isolation structure; and
a dielectric material between the first line segment and the second line segment, wherein an entirety of the dielectric material overlaps the isolation structure.

14. The semiconductor device of claim 13, wherein the width of the first line segment and the width of the second line segment independently range from about 0.01 microns (µm) to about 1.0 µm.

15. The semiconductor device of claim 13, wherein a width of the dielectric material ranges from about 0.01 µm to about 0.1 µm.

16. The semiconductor device of claim 13, further comprising a dummy line segment over the isolation structure.

17. The semiconductor device of claim 16, wherein the dielectric material is between the dummy line segment and the first line segment.

18. The semiconductor device of claim 16, wherein the dielectric material is between the dummy line segment and the second line segment.

19. The semiconductor device of claim 16, wherein an entirety of the dummy line segment overlaps the isolation structure.

20. The semiconductor device of claim 13, further comprising:
a dummy line segment; and
a second dielectric material between the first line segment and the second line segment, wherein the dummy line segment is between the dielectric material and the second dielectric material.

* * * * *